United States Patent
Iizuka et al.

(10) Patent No.: US 10,468,101 B2
(45) Date of Patent: Nov. 5, 2019

(54) SEMICONDUCTOR MEMORY DEVICE

(71) Applicant: TOSHIBA MEMORY CORPORATION, Tokyo (JP)

(72) Inventors: Takahiko Iizuka, Yokohama Kanagawa (JP); Daisaburo Takashima, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/119,828

(22) Filed: Aug. 31, 2018

(65) Prior Publication Data

US 2019/0287615 A1     Sep. 19, 2019

(30) Foreign Application Priority Data

Mar. 16, 2018    (JP) ................................ 2018-049876

(51) Int. Cl.
    *G11C 13/00*         (2006.01)

(52) U.S. Cl.
    CPC ...... *G11C 13/0069* (2013.01); *G11C 13/0026* (2013.01); *G11C 2013/0078* (2013.01)

(58) Field of Classification Search
None
See application file for complete search history.

(56) References Cited

U.S. PATENT DOCUMENTS

| | | | |
|---|---|---|---|
| 7,518,903 B2 | 4/2009 | Shirahama et al. | |
| 7,542,326 B2 | 6/2009 | Yoshimura et al. | |
| 9,076,525 B2 * | 7/2015 | Kaneko | G11C 13/0069 |
| 9,627,059 B2 | 4/2017 | Lin et al. | |
| 2011/0044088 A1 * | 2/2011 | Muraoka | G11C 13/0007 365/148 |
| 2013/0088911 A1 * | 4/2013 | Nakura | G11C 13/0002 365/148 |
| 2019/0115079 A1 * | 4/2019 | Park | G11C 16/10 |

OTHER PUBLICATIONS

Lee et al., A 90 nm 1.8 V 512 Mb Diode-Switch PRAM With 266 MB/s Read Throughput, IEEE Journal of Solid-State Circuits, Jan. 2008, pp. 150-162, vol. 43, No. 1.

* cited by examiner

*Primary Examiner* — Tan T. Nguyen
(74) *Attorney, Agent, or Firm* — Kim & Stewart LLP

(57) ABSTRACT

A semiconductor memory device comprises a memory cell including a resistance change memory element and a write control circuit for setting a resistance state of the resistance change memory element. The write control circuit applies a first voltage signal when setting the resistance change memory element. The first voltage signal rises in a first rise time from a first reference voltage to a first predetermined voltage, maintains at the first predetermined voltage for a first predetermined time period, and then falls from the first predetermined voltage to the first reference voltage in a first falling time. The write circuit applies a second or third voltage signal according to the state being set in the resistance change memory element. In some examples, a predetermined voltage level of the third signal is applied for a period of time longer than a predetermined level of the first and second voltage signals.

20 Claims, 6 Drawing Sheets

FIG. 2H

FIG. 3A
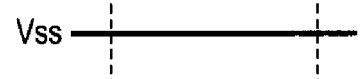
FIG. 3B
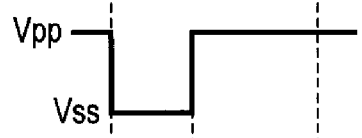
FIG. 3C
FIG. 3D
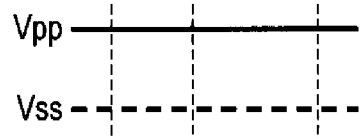
FIG. 3E
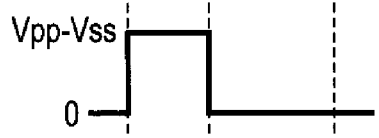
FIG. 3F
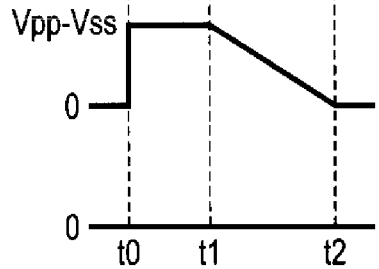
FIG. 3G
FIG. 3H

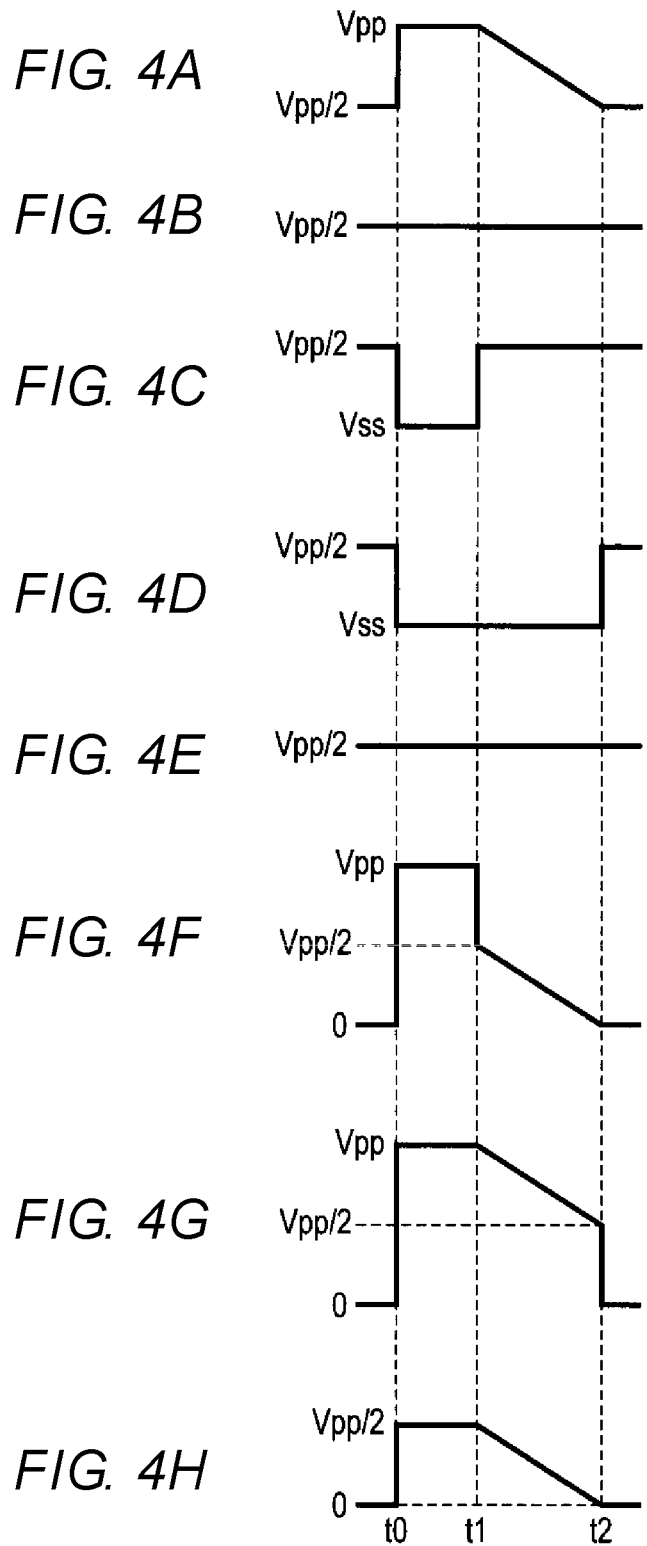

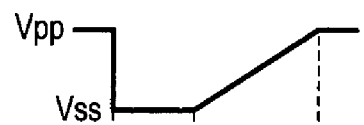
FIG. 5A
FIG. 5B
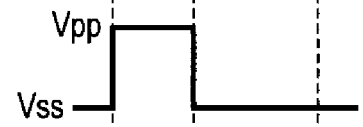
FIG. 5C
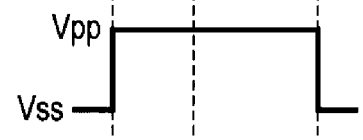
FIG. 5D
FIG. 5E
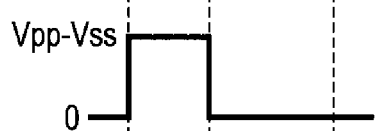
FIG. 5F
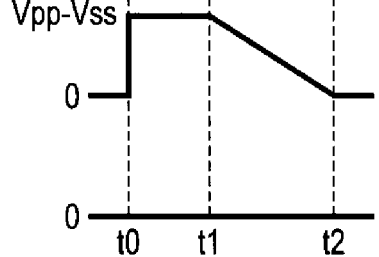
FIG. 5G
FIG. 5H

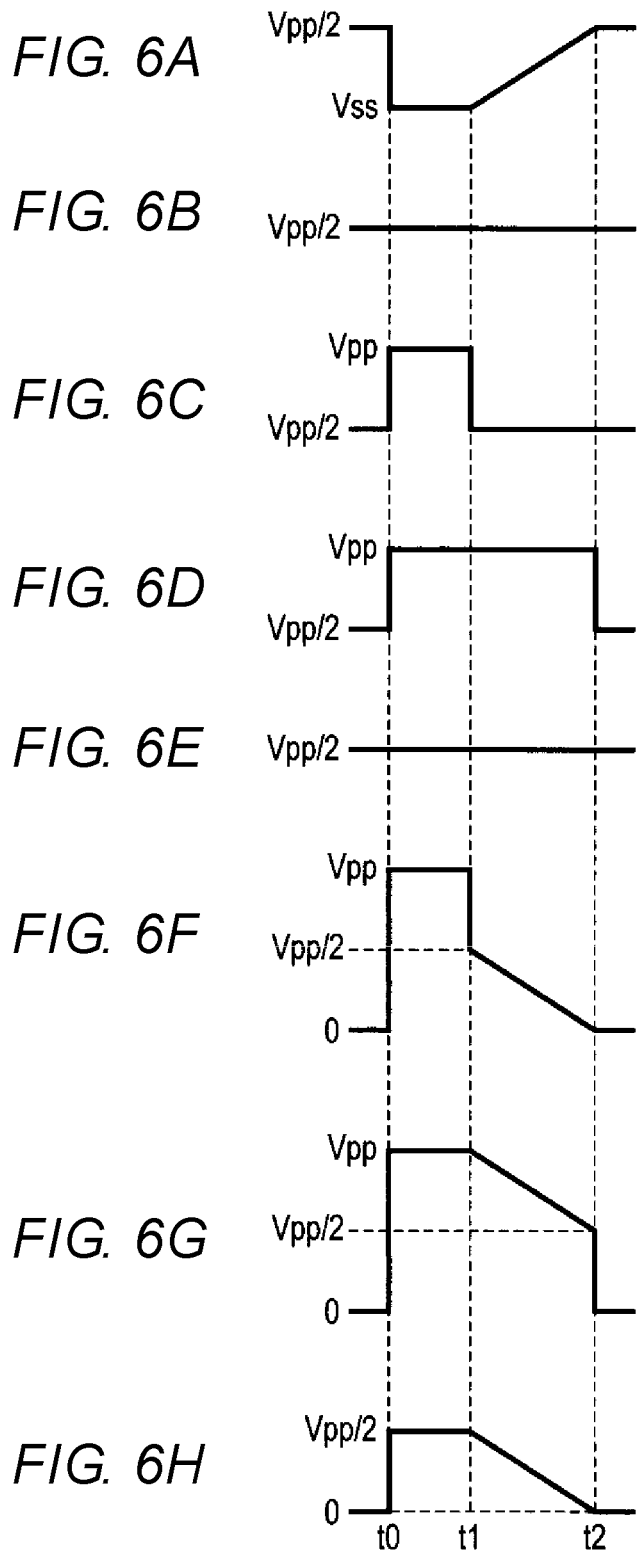

SEMICONDUCTOR MEMORY DEVICE

CROSS-REFERENCE TO RELATED APPLICATION

This application is based upon and claims the benefit of priority from Japanese Patent Application No. 2018-049876, filed Mar. 16, 2018, the entire contents of which are incorporated herein by reference.

FIELD

Embodiments described herein relate generally to a semiconductor memory device.

BACKGROUND

A memory device, or other semiconductor integrated circuit device, in which a metal-oxide-semiconductor (MOS) transistor is supplied on a semiconductor substrate together with a resistance change memory element, such as a phase-change memory element, has been proposed. The resistance change memory element is a nonvolatile memory element, and it is possible to set a written state (a low resistance state or a high resistance state) for the element according to an applied voltage, or more particularly a change rate of the applied voltage.

However, it cannot be said that an appropriate writing method is necessarily obtained in the memory device using the resistance change memory element.

DESCRIPTION OF THE DRAWINGS

FIGS. 2A to 2H are timing charts illustrating aspects of a first write operation performed by a write control circuit.

FIGS. 3A to 3H are timing charts illustrating aspects of a write operation in a comparative example.

FIGS. 4A to 4H are timing charts illustrating aspects of a second write operation performed by a write control circuit.

FIGS. 5A to 5H are timing charts illustrating aspects of a third write operation performed by a write control circuit.

FIGS. 6A to 6H are timing charts illustrating aspects of a fourth write operation performed by a write control circuit.

DETAILED DESCRIPTION

Example embodiments concern appropriate writing methods in a memory device incorporating a resistance change memory element.

In general, according to one embodiment, a semiconductor memory device comprises a plurality of memory cells that are nonvolatile memory cells; a first circuit configured to receive data to be written to the plurality of memory cells, read data from the plurality of memory cells, compare the data to be written to the data as read, identify each memory cell presently storing a data value that differs from a data value to be written to the memory cell, and identify each memory cell presently storing a data value that matches the data value to be written but having a threshold voltage closer to a read voltage than a predetermined reference voltage; and a second circuit configured to simultaneously program the memory cells identified as presently storing the data value that differs from the data value to be written to the memory cell and the memory cells identified as presently storing the data value that matches the data value to be written but has the threshold voltage closer to the read voltage than the predetermined reference voltage.

Example embodiments will now be described with reference to the accompanying drawings.

Figure 1:
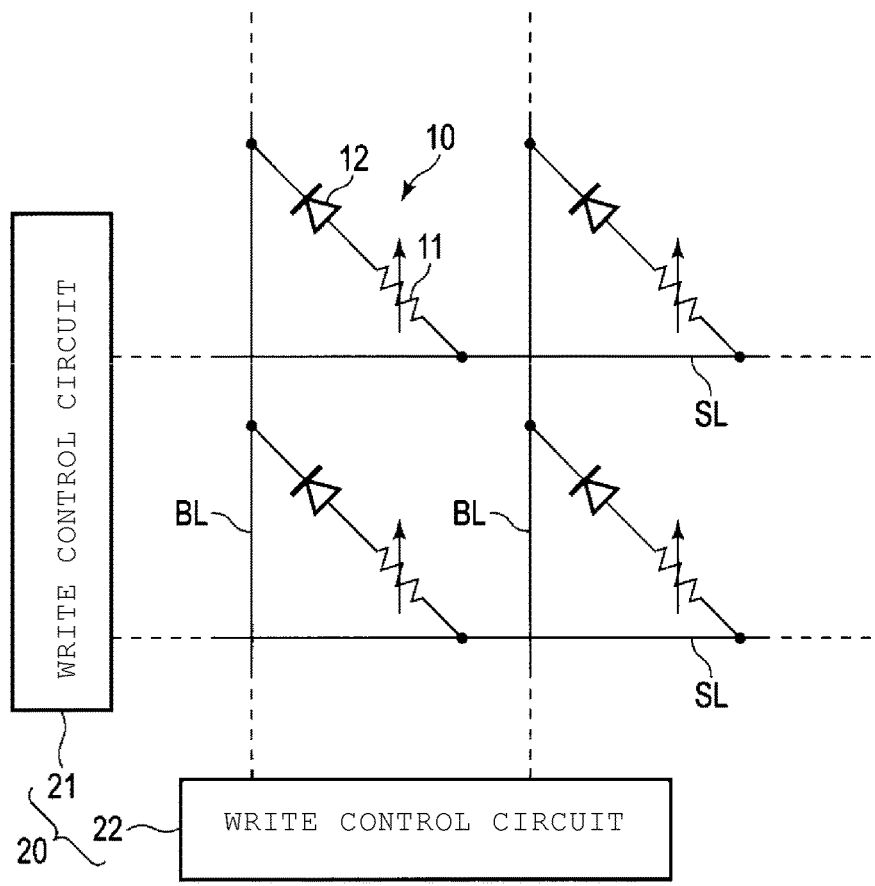
FIG. 1 is an electric circuit diagram illustrating a configuration of a memory device according to an embodiment.

FIG. 1 is an electric circuit diagram illustrating a configuration of a memory device, which is a nonvolatile memory device, according to an embodiment.

As shown in FIG. 1, a memory cell 10 is formed with a resistance change memory element 11 and a selection element 12 connected in series. The resistance change memory element 11 is switchable between a high resistance state and a low resistance state. In a cell array region shown in FIG. 1, a plurality of memory cells 10 is provided in an array.

A source line SL is connected to one end of memory cell 10, and a bit line BL is connected to the other end of the memory cell 10. The source line SL and the bit line BL may be referred to as signal lines in some instances. The "ends" of a memory cell 10 may be referred to as terminals of the memory cell 10 in some instances.

The resistance change memory element 11 can store binary data according its resistance state (high resistance state or low resistance state). The resistance change memory element 11 is not particularly limited to one particular type, but in an embodiment of the present example, a phase change memory (PCM) element is used as the resistance change memory element 11. The selection element 12 may be, for example, a switch element between two terminals. When the voltage applied between the two terminals is equal to or less than a threshold value, the switch element is in a "high resistance" state, for example, an electrically nonconductive state, or an "OFF" state. When the voltage applied between the two terminals is equal to or higher than the threshold value, the switch element changes to a "low resistance" state, for example, an electrically conductive state, or "ON" state. The switch element may have this function whatever the polarity of the voltage across the terminals of the selection element 11. A switch element may contain at least one chalcogen element selected from the group consisting of Te, Se and S. Alternatively, the switch element may contain a chalcogenide, which is a compound containing one or more chalcogen element. In addition, the switch element may contain at least one element selected from the group consisting of B, Al, Ga, In, C, Si, Ge, Sn, As, P and Sb. The first terminal of the selection element 12 is connected to the source line SL side, and the second terminal is connected to the bit line BL side. Hereinafter, an example in which the selection element 12 is a diode arranged such that the first terminal is an anode and the second terminal is a cathode is described; however, the selection element 12 is not limited to diodes.

When a resistance state is set (written) in the resistance change memory element 11, a voltage pulse is applied to the resistance change memory element 11. When the high resistance state is set, the falling of the voltage pulse is made steep (an abrupt change in voltage level). As a result, the resistance change memory element 11 rapidly cools, and its constituent material will be in an amorphous state thereafter. When the low resistance state is set, the falling of the voltage pulse is made shallow (a gradual change in voltage level). As a result, the resistance change memory element 11 is more slowly cooled, and its constituent material will be permitted to organize into a crystalline state.

Writing to the resistance change memory element 11 (setting of the resistance state) is performed by a write control circuit 20. The write control circuit 20 includes a write control circuit 21 for driving a source line SL and a write control circuit 22 for driving a bit line BL.

FIGS. 2A-2H are timing charts each illustrating a first write operation example performed by the write control circuit 20.

Figure 2A:
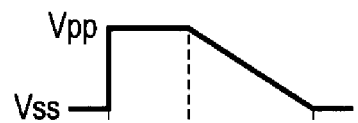

FIG. 2A illustrates a voltage applied to the source line SL connected to a memory cell 10 to which writing is performed (a targeted/addressed/selected memory cell 10). The voltage rises from Vss to Vpp at t0, and the voltage is maintained at Vpp during the period from t0 to t1. Then, the voltage gently falls from Vpp to Vss during the period from t1 to t2.

Figure 2B:

FIG. 2B illustrates a voltage applied to the source line SL connected to the memory cell 10 to which writing is not performed (an untargeted/unaddressed/unselected memory cell 10). The voltage is maintained at a constant value Vss.

Figure 2C:
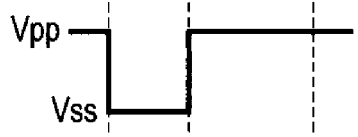

FIG. 2C illustrates a voltage applied to the bit line BL connected to the memory cell 10 to which writing in the high resistance state is performed. The voltage falls from Vpp to Vss at t0, and the voltage is maintained at Vss from t0 to t1. The voltage rises from Vss to Vpp at t1, and the voltage is maintained at Vpp after t1.

Figure 2D:
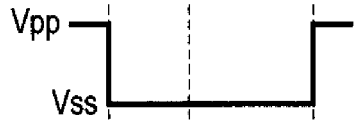

FIG. 2D illustrates a voltage applied to the bit line BL connected to the memory cell 10 to which writing in the low resistance state is performed. The voltage falls from Vpp to Vss at t0, and the voltage is maintained at Vss from t0 to t2. The voltage rises from Vss to Vpp at t2.

Figure 2E:

FIG. 2E illustrates a voltage applied to the bit line BL connected to the unselected memory cell 10 to which writing is not performed. The voltage is maintained at a constant value Vpp.

Figure 2F:
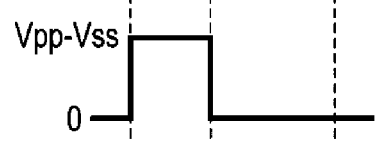

FIG. 2F illustrates a voltage applied to the resistance change memory element 11 in the memory cell 10 to which writing in the high resistance state is performed. That is, it corresponds to a voltage obtained by subtracting the voltage of FIG. 2C from the voltage of FIG. 2A. However, when the diode 12 is biased in the reverse direction, the voltage applied to the resistance change memory element 11 is zero (the same applies to FIGS. 2G and 2H). As shown in FIG. 2F, the voltage applied to the resistance change memory element 11 falls steeply. As a result, the constituent material of the resistance change memory element 11 will be in an amorphous state after the operation.

Figure 2G:
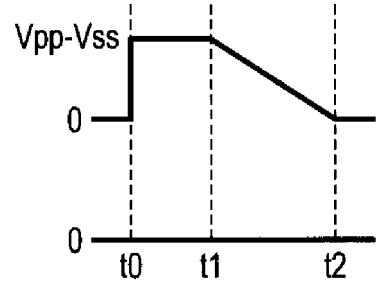

FIG. 2G illustrates a voltage applied to the resistance change memory element 11 of the memory cell 10 to which writing in the low resistance state is performed. That is, it corresponds to a voltage obtained by subtracting the voltage of FIG. 2D from the voltage of FIG. 2A. As shown in FIG. 2G, the voltage applied to the resistance change memory element 11 gently falls. As a result, the constituent material of the resistance change memory element 11 will be in a crystalline state after the operation.

FIG. 2H illustrates a voltage applied to the resistance change memory element 11 of the memory cell 10 to which writing is not being performed. That is, it corresponds to a voltage obtained by subtracting the voltage of FIG. 2E from the voltage of FIG. 2A, and a voltage obtained by subtracting any of the voltages of FIGS. 2C, 2D and 2E from the voltage of FIG. 2B. The voltage applied to the resistance change memory element 11 is zero in this case.

FIGS. 3A-3H are timing charts each illustrating a write operation in a comparative example. FIGS. 3A to 3H illustrate voltages corresponding to FIGS. 2A to 2H, respectively.

As shown in FIGS. 2C and 3C, the voltage applied to the bit line BL connected to the memory cell 10 to which writing in the high resistance state is performed is the same in the embodiment and the comparative example. That is, in both of the embodiment and the comparative example, the voltage is not gently raised. On the other hand, as shown in FIGS. 2D and 3D, the voltage applied to the bit line BL connected to the memory cell 10 to which writing in the low resistance state is performed is different in the embodiment and the comparative example. That is, in the embodiment, the voltage is not gently raised, but in the comparative example, the voltage is gently raised.

As can be seen from the above description, for the comparative example, it is necessary to make the rising characteristics different for the case of writing in the high resistance state and for the case of writing in the low resistance state. In contrast, in the embodiment, it is unnecessary to make the rising characteristics different for the case of writing in the high resistance state and for the case of writing in the low resistance state. Therefore, in the embodiment, a write control can be simplified.

FIGS. 4A-4H are timing charts each illustrating a second write operation example performed by the write control circuit 20. In the following example, a description is provided assuming that in the selection element, no voltage is applied to a resistance-variable element when the threshold voltage is higher than the applied voltage Vpp/2 for a half-selected memory cell and the voltage applied to the memory cell is Vpp/2 or less. However, in actuality, it suffices that the applied voltage be sufficiently small to prevent any problem in the write operation even though a finite voltage might be applied to the resistance-variable element.

FIG. 4A illustrates a voltage applied to the source line SL connected to the memory cell 10 to which writing is performed. The voltage rises from Vpp/2 to Vpp at t0, and the voltage is maintained at Vpp during the period from t0 to t1. Then, the voltage gently falls from Vpp to Vpp/2 during the period from t1 to t2. It is noted that in this example Vss=0 V. In general, for cases where Vss is not 0 V, the voltage before t0 and the voltage after t2 are equal to (Vpp−Vss)/2.

FIG. 4B illustrates a voltage applied to the source line SL connected to the memory cell 10 to which writing is not performed. The voltage is maintained at a constant value Vpp/2.

FIG. 4C illustrates a voltage applied to the bit line BL connected to the memory cell 10 to which writing in the high resistance state is performed. The voltage falls from Vpp/2 to Vss at t0, and the voltage is maintained at Vss from t0 to t1. The voltage rises from Vss to Vpp/2 at t1, and the voltage is maintained at Vpp/2 after t1.

FIG. 4D illustrates a voltage applied to the bit line BL connected to the memory cell 10 to which writing in the low resistance state is performed. The voltage falls from Vpp/2 to Vss at t0, and the voltage is maintained at Vss from t0 to t2. The voltage rises from Vss to Vpp/2 at t2.

FIG. 4E illustrates a voltage applied to the bit line BL connected to the memory cell 10 to which writing is not performed. The voltage is maintained at a constant value Vpp/2.

FIG. 4F illustrates a voltage applied to the resistance change memory element 11 of the memory cell 10 to which writing in the high resistance state is performed. That is, it corresponds to a voltage obtained by subtracting the voltage of FIG. 4C from the voltage of FIG. 4A. At t1, the applied voltage falls abruptly. As a result, the constituent material of the resistance change memory element 11 will be in an amorphous state afterwards. When the threshold value of the selection element is smaller than Vpp/2, then the applied voltage gently falls until the selection element turns off during the period from t1 to t2, but because the magnitude of the applied voltage after t1 is small, the temperature of the resistance change memory element 11 is low. Therefore, the constituent material of the resistance change memory element 11 will not be in a crystalline state afterwards.

FIG. 4G illustrates a voltage applied to the resistance change memory element 11 of the memory cell 10 to which writing in the low resistance state is performed. That is, it corresponds to a voltage obtained by subtracting the voltage of FIG. 4D from the voltage of FIG. 4A. As shown in FIG. 4G, the applied voltage gently falls during the period from t1 to t2. As a result, the constituent material of the resistance change memory element 11 will be in a crystalline state afterwards.

FIG. 4H illustrates a voltage applied to the resistance change memory element 11 of the memory cell 10 to which writing is not performed. That is, it corresponds to a voltage obtained by subtracting the voltage of FIG. 4E from the voltage of FIG. 4A, and a voltage obtained by subtracting any of the voltages of FIGS. 2C, 2D and 2E from the voltage of FIG. 4B. Since only a voltage of Vpp/2 or less is applied to these memory cells, no voltage is applied to the memory element.

The basic operation is the same as that of the first write operation example, and it is possible to obtain the same effect as that of the first write operation example.

It is noted that the above-described first and second write operation examples are generalized and defined as follows.

When one of the high resistance state and the low resistance state is being set in the resistance change memory element, a first voltage signal (corresponding to FIGS. 2A and 4A in the first and second write operation examples, respectively) is applied to the first signal line, corresponding to the source line SL in the first and second write operation examples. The first voltage signal rises in a first rise time width, which is substantially a zero length time period in the first and second write operation examples, and is maintained at a first predetermined voltage (equal to Vpp in the first and second write operation examples) for a first predetermined time width (equal to t1−t0 in the first and second write operation examples), and then falls in a first fall time width (equal to t2−t1 in the first and second write operation examples).

When the high resistance state is set in the resistance change memory element, a second voltage signal, corresponding to FIGS. 2C and 4C in the first and second write operation examples, respectively, is applied to the second signal line, corresponding to the bit line BL in the first and second write operation examples. The second voltage signal falls in a second fall time width, which is substantially a zero length time period in the first and second write operation examples, and is maintained at a second predetermined voltage (equal to Vss in the first and second write operation examples) for a second predetermined time width (equal to t1−t0 in the first and second write operation examples), and then rises in a second rise time width, which is substantially a zero length time period in the first and second write operation examples.

When the low resistance state is set in the resistance change memory element, a third voltage signal, corresponding to FIGS. 2D and 4D in the first and second write operation examples, respectively, is applied to the second signal line, corresponding to the bit line BL in the first and second write operation examples. The third voltage signal falls in a third fall time width, which is substantially a zero length time period in the first and second write operation examples, and is maintained at a third predetermined voltage (equal to Vss in the first and second write operation examples) for a third predetermined time width (equal to t2−t0 in the first and second write operation examples), and then rises in a third rise time width, which is substantially a zero length time period in the first and second write operation examples.

The first fall time width (equal to t2−t1 in the first and second write operation examples) is longer than both of the second rise time width and the third rise time width. Further, the third predetermined time width (equal to t2−t0 in the first and second write operation examples) is longer than both of the first predetermined time width and the second predetermined time width.

In addition, it is preferable that the first and second write operation examples generally satisfy the following conditions.

It is preferable that the first predetermined time width and the second predetermined time width are equal to each other.

It is preferable that the third predetermined time width) is equal to or longer than the total of the first predetermined time width (t1−t0 in the first and second write operation examples) and the first fall time width (t2−t1 in the first and second write operation examples).

Furthermore, it is preferable that the first write operation example generally satisfies the following conditions.

It is preferable that the voltage applied to the first signal line before the first voltage signal (corresponding to FIG. 2A in the first write operation example) rises, the second predetermined voltage, and the third predetermined voltage are equal to each other. In the first write operation example described above, the voltage applied to the first signal line before the first voltage signal, the second predetermined voltage, and the third predetermined voltage are each equal to voltage Vss. In addition, it is preferable that the first predetermined voltage, the voltage applied to the second signal line before the second voltage signal (corresponding to FIG. 2C in the first write operation example) falls, and the voltage applied to the second signal line before the third voltage signal (corresponding to FIG. 2D in the first write operation example) falls are equal to each other. In the first write operation example described above each of these voltages is equal to voltage Vpp.

Furthermore, it is preferable that the above-described second write operation example generally satisfies the following conditions.

It is preferable that the voltage applied to the first signal line before the first voltage signal (corresponding to FIG. 4A in the second write operation example) rises, the voltage applied to the second signal line before the second voltage signal (corresponding to FIG. 4C in the second write operation example) falls, and the voltage applied to the second signal line before the third voltage signal (corresponding to FIG. 4D in the second write operation example) falls are the same reference voltage. In the second write operation example, each of these voltages is equal to the voltage Vpp/2. It is preferable that the first predetermined voltage (voltage Vpp in the second write operation example) is a high voltage with respect to the reference voltage (voltage Vpp/2 in the second write operation example), and the second predetermined voltage (voltage Vss) and the third predetermined voltage (voltage Vss) are both lower voltage than the reference voltage (voltage Vpp/2).

FIGS. 5A to 5H are timing charts each illustrating a third write operation example performed by the write control circuit 20.

FIG. 5A illustrates a voltage applied to the bit line BL connected to the memory cell 10 to which writing is performed. The voltage falls from Vpp to Vss at t0, and the voltage is maintained at Vss during the period from t0 to t1. Then, the voltage gently rises from Vss to Vpp during the period from t1 to t2.

FIG. 5B illustrates a voltage applied to the bit line BL connected to the memory cell 10 to which writing is not performed. The voltage is maintained at a constant value Vpp.

FIG. 5C illustrates a voltage applied to the source line SL connected to the memory cell 10 to which writing in the high resistance state is performed. The voltage rises from Vss to Vpp at t0, and the voltage is maintained at Vpp from t0 to t1. The voltage falls from Vpp to Vss at t1, and the voltage is maintained at Vss after t1.

FIG. 5D illustrates a voltage applied to the source line SL connected to the memory cell 10 to which writing in the low resistance state is performed. The voltage rises from Vss to Vpp at t0, and the voltage is maintained at Vpp from t0 to t2. The voltage rises from Vpp to Vss at t2.

FIG. 5E illustrates a voltage applied to the source line SL connected to the memory cell 10 to which writing is not performed. The voltage is maintained at a constant value Vss.

FIG. 5F illustrates a voltage applied to the resistance change memory element 11 of the memory cell 10 to which writing in the high resistance state is performed. That is, it corresponds to a voltage obtained by subtracting the voltage of FIG. 5A from the voltage of FIG. 5C. However, when the diode 12 is biased in the reverse direction, the voltage applied to the resistance change memory element 11 is zero (the same applies to FIGS. 5G and 5H). As shown in FIG. 5F, the voltage applied to the resistance change memory element 11 falls steeply. As a result, the constituent material of the resistance change memory element 11 will be in an amorphous state.

FIG. 5G illustrates a voltage applied to the resistance change memory element 11 of the memory cell 10 to which writing in the low resistance state is performed. That is, it corresponds to a voltage obtained by subtracting the voltage of FIG. 5A from the voltage of FIG. 5D. As shown in FIG. 5G, the voltage applied to the resistance change memory element 11 gently falls. As a result, the constituent material of the resistance change memory element 11 will be in a crystalline state.

FIG. 5H illustrates a voltage applied to the resistance change memory element 11 of the memory cell 10 to which writing is not performed. That is, it corresponds to a voltage obtained by subtracting the voltage of FIG. 5A or 5B from the voltage of FIG. 5E, and a voltage obtained by subtracting the voltage of FIG. 5B from the voltage of FIG. 5C or 5D. The voltage applied to the resistance change memory element 11 is substantially zero in this instance.

In the write operation example, it is unnecessary to make the falling characteristics different for writing in the high resistance state and writing in the low resistance state. Therefore, as in the first write operation example, the write control can be simplified.

FIGS. 6A to 6H are timing charts each illustrating a fourth write operation example performed by the write control circuit 20.

FIG. 6A illustrates a voltage applied to the bit line BL connected to the memory cell 10 to which writing is performed. The voltage falls from Vpp/2 to Vss at t0, and the voltage is maintained at Vss during the period from t0 to t1. Then, the voltage gently rises from Vss to Vpp/2 during the period from t1 to t2. It is noted that in the embodiment, Vss=0. In general, when Vss is not 0, the voltage before t0 and the voltage after t2 are equal to (Vpp−Vss)/2.

FIG. 6B illustrates a voltage applied to the bit line BL connected to the memory cell 10 to which writing is not performed. The voltage is maintained at a constant value Vpp/2.

FIG. 6C illustrates a voltage applied to the source line SL connected to the memory cell 10 to which writing in the high resistance state is performed. The voltage rises from Vpp/2 to Vpp at t0, and the voltage is maintained at Vpp from t0 to t1. The voltage falls from Vpp to Vpp/2 at t1, and the voltage is maintained at Vpp/2 after t1.

FIG. 6D illustrates a voltage applied to the source line SL connected to the memory cell 10 to which writing in the low resistance state is performed. The voltage rises from Vpp/2 to Vpp at t0, and the voltage is maintained at Vpp from t0 to t2. The voltage falls from Vpp to Vpp/2 at t2.

FIG. 6E illustrates a voltage applied to the source line SL connected to the memory cell 10 to which writing is not performed. The voltage is maintained at a constant value Vpp/2.

FIG. 6F illustrates a voltage applied to the resistance change memory element 11 of the memory cell 10 to which writing in the high resistance state is performed. That is, it corresponds to a voltage obtained by subtracting the voltage of FIG. 6A from the voltage of FIG. 6C. At t1, the applied voltage falls suddenly. As a result, the constituent material of the resistance change memory element 11 becomes in an amorphous state. When the threshold value of the selection element is smaller than Vpp/2, then the applied voltage gently falls until the selection element turns off during the period from t1 to t2, but since the magnitude of the applied voltage after t1 is small, the temperature of the resistance change memory element 11 is low. Therefore, the constituent material of the resistance change memory element 11 will not be in a crystalline state.

FIG. 6G illustrates a voltage applied to the resistance change memory element 11 of the memory cell 10 to which writing in the low resistance state is performed. That is, it corresponds to a voltage obtained by subtracting the voltage of FIG. 6A from the voltage of FIG. 6D. As shown in FIG. 6G, the applied voltage gently falls during the period from t1 to t2. As a result, the constituent material of the resistance change memory element 11 will be in a crystalline state.

FIG. 6H illustrates a voltage applied to the resistance change memory element 11 of the memory cell 10 to which writing is not performed. That is, it corresponds to a voltage obtained by subtracting the voltage of FIG. 6A or 6B from the voltage of FIG. 6E, and a voltage obtained by subtracting the voltage of FIG. 6B from the voltage of FIG. 6C or 6D. Since only a voltage of Vpp/2 or less is applied to these memory cells, no program voltage is applied to the memory element.

The basic operation is otherwise the same as that of the third write operation example, and it is possible to obtain the same effect as that of the third write operation example.

It is noted that the above-described third and fourth write operation examples are generalized and defined as follows.

When one of the high resistance state and the low resistance state is set in the resistance change memory element, a first voltage signal (corresponding to FIGS. 5A and 6A in the third and fourth write operation examples, respectively) is applied to the first signal line (corresponding to the bit line BL in the third and fourth write operation examples). The first voltage signal falls in a first fall time width, which is substantially a zero length time period in the third and fourth write operation examples, and is maintained at a first predetermined voltage (equal to voltage Vss in the third and fourth write operation examples) in a first predetermined time width (equal to t1–t0 in the third and fourth write operation examples), and then rises in a first rise time width (equal to t2–t1 in the third and fourth write operation examples).

When the high resistance state is set in the resistance change memory element, a second voltage signal (corresponding to FIGS. 5C and 6C in the third and fourth write operation examples, respectively) is applied to the second signal line (corresponding to the source line SL in the third and fourth write operation examples). The second voltage signal rises in a second rise time width, which is substantially a zero length time period in the third and fourth write operation examples, and is maintained at a second predetermined voltage (equal to Vpp in the third and fourth write operation examples) for a second predetermined time width (equal to t1–t0 in the third and fourth write operation examples), and then falls in a second fall time width, which is substantially a zero length time period in the third and fourth write operation examples.

When the low resistance state is set in the resistance change memory element, a third voltage signal (corresponding to FIGS. 5D and 6D in the third and fourth write operation examples, respectively) is applied to the second signal line. The third voltage signal rises in a third rise time width, which is substantially a zero length time period in the third and fourth write operation examples, and is maintained at a third predetermined voltage (equal to Vpp in the third and fourth write operation examples) for a third predetermined time width (equal to t2–t0 in the third and fourth write operation examples), and then falls in a third fall time width, which is substantially a zero length time period in the third and fourth write operation examples.

The first rise time width (t2–t1 in the third and fourth write operation examples) is longer than both of the second fall time width and the third fall time width. Further, the third predetermined time width is longer than both of the first predetermined time width and the second predetermined time width.

Further, it is preferable that the above-described third and fourth write operation examples generally satisfy the following conditions.

It is preferable that the first predetermined time width and the second predetermined time width are equal to each other.

It is preferable that the third predetermined time width (t2–t0 in the third and fourth write operation examples) is equal to or longer than the total time width of the first predetermined time width (t1–t0 in the third and fourth write operation examples) and the first rise time width (t2–t1 in the third and fourth write operation examples).

Furthermore, it is preferable that the above-described third write operation example generally satisfies the following conditions.

It is preferable that the voltage applied to the first signal line before the first voltage signal falls, the second predetermined voltage), and the third predetermined voltage are equal to each other in the third write operation example. In addition, it is preferable that the first predetermined voltage, the voltage applied to the second signal line before the second voltage signal rises, and the voltage applied to the second signal line before the third voltage signal rises are equal to each other. In the third write operation each of these voltages is equal to voltage Vss.

Furthermore, it is preferable that the fourth write operation example generally satisfies the following conditions.

It is preferable that the voltage applied to the first signal line before the first voltage signal falls, the voltage applied to the second signal line before the second voltage signal rises, and the voltage applied to the second signal line before the third voltage signal rises are the same reference voltage. In the fourth write operation example, each of these voltages is equal to Vpp/2. It is preferable that the first predetermined voltage is a lower voltage with respect to the reference voltage (voltage Vpp/2), and the second predetermined voltage and the third predetermined voltage are both a high voltage with respect to the reference voltage (voltage Vpp/2).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell including a resistance change memory element connected in series with a selection element;
a first signal line connected to a first terminal of the memory cell;
a second signal line connected to a second terminal of the memory cell; and
a write control circuit for setting a resistance state of the resistance change memory element, wherein the write control circuit is configured to:
apply a first voltage signal to the first signal line when setting the resistance change memory element to a high resistance state or a low resistance state, the write control circuit providing the first voltage signal to rise in a first signal rise time width from a first reference voltage to a first predetermined voltage, maintain at the first predetermined voltage for a first predetermined time period, and then fall from the first predetermined voltage to the first reference voltage in a first signal falling time width,
apply a second voltage signal to the second signal line when setting the resistance change memory element to the high resistance state, the write control circuit providing the second voltage signal to fall from a second reference voltage to a second predetermined voltage in a second signal falling time width, maintain at the second predetermined voltage for a second predetermined time period, and then rise from the second predetermined voltage to the second reference voltage in a second signal rising time width, and
apply a third voltage signal to the second signal line when setting the resistance change memory element to the low resistance state, the write control circuit providing the third voltage signal to fall from a third reference voltage to a third predetermined voltage in a third signal falling time width, maintain at the third predetermined voltage for a third predetermined time period, and then rise from the third predetermined voltage to the third reference voltage in a third signal rising time width, wherein
the first signal falling time width is set by the write control circuit to be longer than both of the second signal rising time width and the third signal rising time width, and the third predetermined time period is set by the write control circuit to be longer than both of the first predetermined time period and the second predetermined time period.

2. The semiconductor memory device according to claim 1, wherein the first predetermined time period and the second predetermined period width are equal to each other in time length.

3. The semiconductor memory device according to claim 1, wherein the third predetermined time period is equal to or longer than a total time for the first predetermined time period and the first signal falling time width.

4. The semiconductor memory device according to claim 1, wherein
the first reference voltage, the second predetermined voltage, and the third predetermined voltage are equal to each other, and
the first predetermined voltage, the second reference voltage, and the third reference voltage are equal to each other.

5. The semiconductor memory device according to claim 1, wherein the first reference voltage, the second reference voltage, and the third reference voltage are equal to each other.

6. The semiconductor memory device according to claim 1, wherein the resistance change memory element comprises a chalcogenide material.

7. The semiconductor memory device according to claim 1, wherein the resistance change memory element is a phase change memory element.

8. The semiconductor memory device according to claim 1, wherein the selection element is a diode.

9. The semiconductor memory device according to claim 8, wherein a cathode of the diode is connected to the second signal line.

10. A semiconductor memory device, comprising:
a resistance change memory element having a high resistance state and a low resistance state;
a selection element connected in series with the resistance change memory element between a source line and a bit line; and
a write control circuit configured to set the high resistance state and the low resistance state in the resistance change memory element by application of voltage signals to the source line and the bit line, wherein
the write control circuit applies:
a first voltage signal to the source line when setting the high resistance state and the low resistance state in the resistance change memory element, the first voltage signal falling in a first fall time width from a first reference voltage to a first predetermined voltage, being maintained at the first predetermined voltage for a first predetermined time period, and then rising in a first rise time width to the first reference voltage,
a second voltage signal to the bit line when setting the high resistance state in the resistance change memory element, the second voltage signal rising in a second rise time width from a second reference voltage to a second predetermined voltage, being maintained at the second predetermined voltage for a second predetermined time period, and then falling in a second fall time width to the second reference voltage, and
a third voltage signal to the bit line when setting the low resistance state in the resistance change memory element, the third voltage signal rising in a third rise time width from a third reference voltage to a third predetermined voltage, being maintained at the third predetermined voltage for a third predetermined time period, and then falling in a third fall time width to the third reference voltage,
the first rise time width is longer than the second fall time width and the third fall time width, and
the third predetermined time period is longer than the first predetermined period width and the second predetermined time period.

11. The semiconductor memory device according to claim 10, wherein the first predetermined time period and the second predetermined time period are equal to each other.

12. The semiconductor memory device according to claim 10, wherein the third predetermined time period is equal to or greater than a sum of the first predetermined time period and the first rise time width.

13. The semiconductor memory device according to claim 10, wherein the first predetermined voltage, the second reference voltage, and the third reference voltage are equal to each other.

14. The semiconductor memory device according to claim 10, wherein
the first reference voltage, the second predetermined voltage, and the third predetermined voltage are equal to each other, and
the first predetermined voltage, the second reference voltage, and the third reference voltage are equal to each other.

15. The semiconductor memory device according to claim 10, wherein the resistance change memory element comprises a chalcogenide material.

16. A method of controlling a write operation in a semiconductor memory device, comprising:
applying a first voltage signal to a first signal line connected to a first terminal of a memory cell including a resistance change element connected in series with a selection element between the first terminal and a second terminal, the first voltage signal being applied when setting the resistance change memory element to a high resistance state or a low resistance state, the first voltage signal rising in a first signal rise time width from a first reference voltage to a first predetermined voltage, maintaining at the first predetermined voltage for a first predetermined time period, and then falling from the first predetermined voltage to the first reference voltage in a first signal falling time width,
applying a second voltage signal to a second signal line connected to the second terminal when setting the resistance change memory element to the high resistance state, the second voltage signal to falling from a second reference voltage to a second predetermined voltage in a second signal falling time width, maintaining at the second predetermined voltage for a second predetermined time period, and then rising from the second predetermined voltage to the second reference voltage in a second signal rising time width, and
applying a third voltage signal to the second signal line when setting the resistance change memory element to the low resistance state, the third voltage signal falling from a third reference voltage to a third predetermined voltage in a third signal falling time width, maintaining at the third predetermined voltage for a third predetermined time period, and then rising from the third predetermined voltage to the third reference voltage in a third signal rising time width, wherein the first signal falling time width is longer than both of the second signal rising time width and the third signal rising time width, and the third predetermined time period is longer than both of the first predetermined time period and the second predetermined time period.

17. The method according to claim 16, wherein the first predetermined time period and the second predetermined period width are equal to each other in time length.

18. The method according to claim 16, wherein the third predetermined time period is equal to or longer than a total time for the first predetermined time period and the first signal falling time width.

19. The method according to claim 16, wherein the first reference voltage, the second predetermined voltage, and the third predetermined voltage are equal to each other, and the first predetermined voltage, the second reference voltage, and the third reference voltage are equal to each other.

20. The method according to claim 16, wherein the first reference voltage, the second reference voltage, and the third reference voltage are equal to each other.

\* \* \* \* \*